US012740489B2

(12) United States Patent
Mayer et al.

(10) Patent No.: US 12,740,489 B2
(45) Date of Patent: Sep. 15, 2026

(54) METHOD FOR TRANSFERRING AN OPTOELECTRONIC DEVICE

(71) Applicant: ALEDIA, Echirolles (FR)

(72) Inventors: Frédéric Mayer, Moirans (FR); Clémence Tallet, Saint-Egreve (FR); Nohora Caicedo, Grenoble (FR)

(73) Assignee: ALEDIA, Echirolles (FR)

( * ) Notice: Subject to any disclaimer, the term of this patent is extended or adjusted under 35 U.S.C. 154(b) by 350 days.

(21) Appl. No.: 18/701,086

(22) PCT Filed: Oct. 13, 2022

(86) PCT No.: PCT/EP2022/078533
§ 371 (c)(1),
(2) Date: Apr. 12, 2024

(87) PCT Pub. No.: WO2023/062139
PCT Pub. Date: Apr. 20, 2023

(65) Prior Publication Data

US 2024/0347518 A1 Oct. 17, 2024

(30) Foreign Application Priority Data

Oct. 15, 2021 (FR) ...................................... 2110975

(51) Int. Cl.
*H10W 90/00* (2026.01)
*H10H 20/01* (2025.01)

(52) U.S. Cl.
CPC .......... *H10W 90/00* (2026.01); *H10H 20/018* (2025.01)

(58) Field of Classification Search
CPC ............................ H10H 20/018; H10W 90/00
See application file for complete search history.

(56) References Cited

U.S. PATENT DOCUMENTS

| | | | | |
|---|---|---|---|---|
| 9,379,092 B2 | 6/2016 | Hu et al. | | |
| 2010/0317132 A1* | 12/2010 | Rogers | H10W 90/00 | 257/E33.059 |
| 2014/0084240 A1* | 3/2014 | Hu | H10W 72/071 | 438/22 |
| 2017/0170049 A1* | 6/2017 | Hu | H10W 72/071 | |

(Continued)

FOREIGN PATENT DOCUMENTS

EP 3840030 A1 6/2021

OTHER PUBLICATIONS

International Search Report issued in corresponding International Application No. PCT/EP2022/078533, mailed Jan. 2, 2023, European Patent Office, Rijswijk, Netherlands, pp. 1-2.

(Continued)

*Primary Examiner* — Shaun M Campbell
(74) *Attorney, Agent, or Firm* — HAUPTMAN HAM, LLP

(57) ABSTRACT

A method for transferring a device from a first substrate to a second substrate by way of a manipulation substrate. The method includes bonding the device to the manipulation substrate by way of an assembly layer at a bonding surface, partially etching the assembly layer so as to conserve a narrow portion interposed between the device and the manipulation substrate, the narrow portion having a cross section strictly smaller than the bonding surface, the method being characterized in that the assembly layer is formed beforehand on the manipulation substrate and exclusively on the manipulation substrate.

19 Claims, 6 Drawing Sheets

(56) References Cited

U.S. PATENT DOCUMENTS

| | | | |
|---|---|---|---|
| 2017/0278733 | A1* | 9/2017 | Chang ................. H10P 72/0446 |
| 2018/0166429 | A1 | 6/2018 | Chong et al. |
| 2020/0144092 | A1 | 5/2020 | Radauscher et al. |

OTHER PUBLICATIONS

Written Opinion issued in corresponding International Application No. PCT/EP2022/078533, mailed Jan. 2, 2023, European Patent Office, Rijswijk, Netherlands, pp. 1-7.

* cited by examiner

METHOD FOR TRANSFERRING AN OPTOELECTRONIC DEVICE

The present application is a U.S. National Phase of International Application Number PCT/EP2022/078533, filed Oct. 13, 2022, which claims priority to French Application No. 2110975, filed Oct. 15, 2021.

TECHNICAL FIELD OF THE INVENTION

The present invention relates to the field of semiconductor technologies. It finds a particularly advantageous application in the manufacture of optoelectronic devices having a three-dimensional structure, for example light-emitting diodes.

PRIOR ART

The microelectronic or optoelectronic devices may be made over a first substrate, called donor substrate, and then transferred onto a second substrate, called receiver substrate.

In the case where the initial orientation of the devise should be preserved, the step of transferring the devices from the donor substrate onto the receiver substrate is typically done via a handling substrate.

The devices, possibly individualised over the donor substrate or over the handling substrate, are first bonded at their tops over the handling substrate. The donor substrate is then removed generally by mechanical trimming. This allows clearing the bases of the devices.

Afterwards, the devices are transferred onto the receiver substrate and assembled thereon at their bases. Thus, the bases of the devices initially in contact with the donor substrate are, at the end of transferring, in contact with the receiver substrate.

The handling substrate is removed so as to clear the tops of the devices. Preferably, this handling substrate is preserved in order to be used again, typically for another transferring.

Hence, bonding between the handling substrate and the tops of the devices should have an adhesive force that is high enough to withstand the mechanical trimming step. In contrast, bonding between the handling substrate and the tops of the devices should have an adhesive force that is low enough to remove the handling substrate and clear the tops of the devices, after transferring onto the receiver substrate.

One solution consists in using a bond whose adhesive properties vary according to an external parameter, typically temperature. However, this solution is not suitable for transferring temperature-sensitive devices. Also, the amplitude of variation of the adhesive force of such a bond is not enough to ensure both a good stability of the devices during removal of the donor substrate, and an easy peel-off during removal of the handling substrate.

Another solution consists in forming a stabilisation layer and a sacrificial structure partially wrapping the device, during the manufacture of the device, as disclosed by the document U.S. Pat. No. 9,379,092 B2. After transferring the device and the elements wrapping it onto the handling substrate, the donor substrate is removed by trimming. The sacrificial structure and the stabilisation layer allow holding and stabilising the device during trimming. Afterwards, etching of the sacrificial structure allows partially clearing the device. The device is thereby held only by a pad with small dimensions. The device is then assembled onto a receiver substrate and the stabilisation layer removed off the handling substrate.

Although this solution allows preserving a significant adhesive force during trimming of the donor substrate, then reducing this adhesive force before removal of the handling substrate, the manufacture of the device should be adapted to provide for and form the sacrificial structure in particular. This makes the method complex and constraining. This increases the cost of the transfer method. The manufacture of the pad is related to that of the device. This limits possibilities with regards to management of the steps of the transfer.

The present invention aims to overcome at least partially the above-mentioned drawbacks.

In particular, an object of the present invention is to provide a method for transferring an optoelectronic device improving the management of the transfer steps. Another object of the present invention is to provide a method for transferring an optoelectronic device whose cost is reduced.

The other objects, features and advantages of the present invention will become apparent upon examining the following description and the appended drawings. It should be understood that other advantages may be included.

SUMMARY OF THE INVENTION

To achieve the above-mentioned objectives, a first aspect of the invention relates to a method for transferring an optoelectronic device from a first substrate to a second substrate via a handling substrate. The method comprises at least the following steps:

- provide the first substrate carrying the optoelectronic device,
- provide the handling substrate,
- bond the optoelectronic device over the handling substrate via a bonding layer at a first face of the device, said first face having a bonding surface extending according to a base plane xy,
- remove the first substrate,
- partially etch the bonding layer so as to preserve a narrow portion of the bonding layer interposed between the first face of the device and the handling substrate, said narrow portion having a cross-section, considered in a plane parallel to the base plane xy, strictly smaller than the bonding surface,
- detach the optoelectronic device of the handling substrate.

Advantageously, the bonding layer is formed beforehand over the handling substrate and only over the handling substrate, before bonding the device.

Thus, it is not necessary to provide for a layer or a sacrificial portion over the device itself.

Afterwards, the narrow portion is formed directly in the bonding layer by partial etching of the bonding layer. The transfer method is simplified. The costs are reduced.

In contrast with the solution disclosed by the document U.S. Pat. No. 9,379,092 B2 which provides for the formation of a narrow portion before or during bonding, the narrow portion can herein be formed a posteriori, after bonding and after removal of the first substrate. This improves the management of the transfer steps. It is no longer necessary to provide for a narrow portion a priori.

In the case of a narrow portion is nevertheless provided a priori, for example in the form of a pad, this pad is integrated to the bonding layer before bonding the device thereon. The manufacture of the pad is done independently of the manufacture of the device, in contrast with the solution disclosed by the document U.S. Pat. No. 9,379,092 B2. This also improves the management of the transfer steps, which can be independent of the steps of manufacturing the device. In particular, the handling substrate comprising the bonding layer and/or the pads can advantageously be used again, for example to perform another transfer of optoelectronic devices.

The device is bonded onto the bonding layer at the first face, which typically corresponds to a top of the device, and preferably only at this first face. The transfer method is even more simplified and the related costs are even more reduced.

BRIEF DESCRIPTION OF THE FIGURES

The aims, objects, as well as the features and advantages of the invention will appear better from the detailed description of embodiments of the latter which are illustrated by the following appended drawings wherein:

FIGS. 10 to 12A illustrate steps of a method for transferring devices according to another embodiment of the present invention.

FIGS. 11B to 12B respectively illustrate variants of the steps illustrated in FIGS. 11A and 12A.

Figure 1:
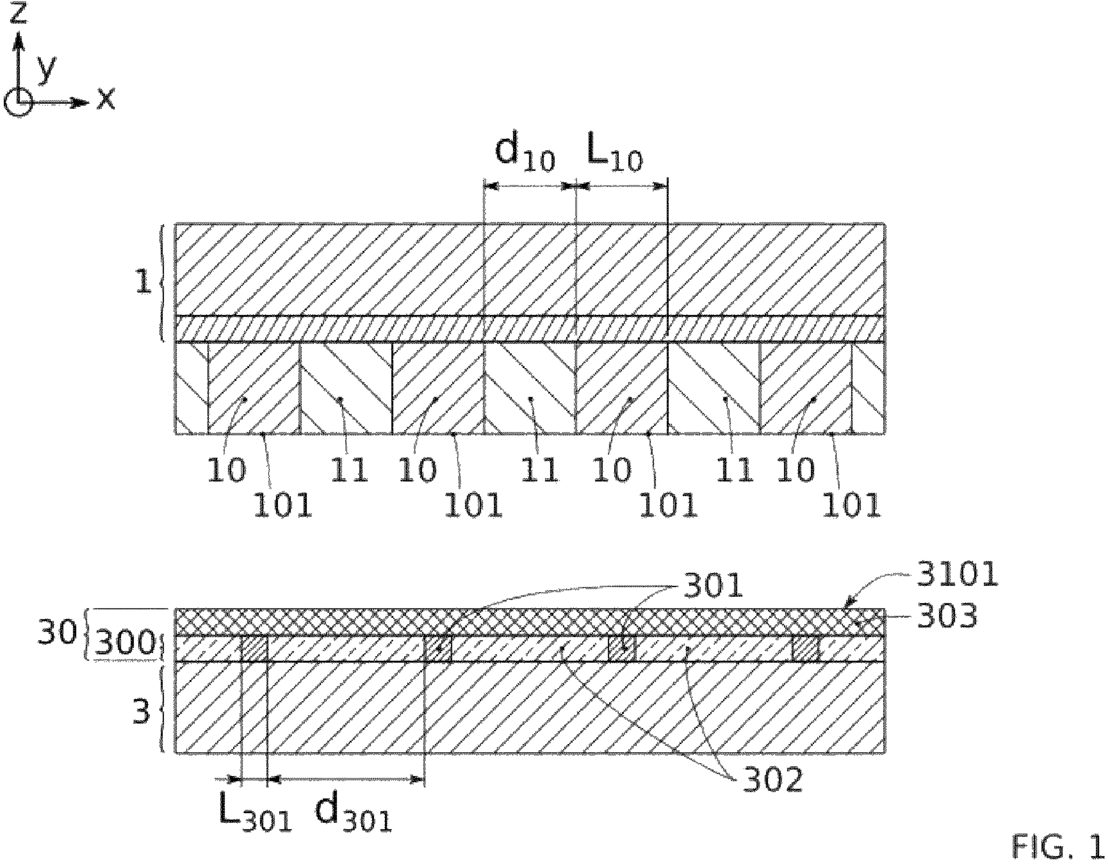
FIG. 1 illustrates a step of assembling a donor substrate carrying devices and a handling substrate, according to an embodiment of the present invention.

The drawings are provided as examples and do not limit the invention. They form schematic representations intended to facilitate understanding of the invention and are not necessarily to the scale of practical applications. In particular, the dimensions of the different elements implemented by the method (bonding layer, pad, optoelectronic device, substrate . . . ) are not necessarily representative of reality.

DETAILED DESCRIPTION

Before starting a detailed review of embodiments of the invention, optional features are set out hereinafter which may possibly be used in combination or alternatively:

According to one example, the bonding surface extends only according to the base plane xy.

According to one example, the bonding layer comprises at least one bond layer.

According to one example, the detachment of the optoelectronic device comprises:

- transferring the optoelectronic device onto a second substrate, at a second face of the device opposite to the first face,
- removing the handling substrate.

According to one example, the first face of the device is only in contact with the bond layer. This allows equalising the adhesive force between the device and the handling substrate.

According to one example, the partial etching of the bonding layer comprises:

- an anisotropic etching directed mainly according to a direction z normal to the base plane xy and configured to remove the bonding layer at the boundary of the device, in projection according to a direction z normal to the base plane xy, so as to cut out the device, then
- an isotropic etching configured to form the narrow portion beneath the device, in projection according to a direction z normal to the base plane xy.

According to one example, the anisotropic etching is performed by cutting. According to one example, cutting is done with laser. According to another example, cutting is done by sawing.

According to another example, cutting is done by plasma.

According to one example, the anisotropic and isotropic etchings are performed by plasma.

According to one example, the isotropic etching corresponds to an over-etching operated at the end of the anisotropic etching.

According to one example, the isotropic etching corresponds to a step of over-etching obtained by exceeding a predetermined duration threshold for the anisotropic etching, and by carrying on the anisotropic etching for an over-etching duration beyond said predetermined duration threshold. This allows obtaining a pad with the desired section. In particular, the stoppage of the partial etching is done by monitoring the over-etching duration.

According to one example, the anisotropic etching is configured to remove the bonding layer over the entire thickness of the bonding layer.

According to one example, the bonding layer comprises a composite layer over the handling substrate, said composite layer comprising at least one pad having an outer wall based on a first material A, and a matrix based on a second material B.

According to one example, the bonding layer comprises a bond layer based on a glue C over the composite layer, opposite the device.

According to one example, the method further comprises the formation of a bondlayer over the composite layer or over the entire first face of the device, prior to bonding the device, so that said glue layer (303) is interposed between the composite layer and the first face of the device, after bonding.

According to one example, the at least one pad comprises a shell having the outer wall based on the first material A, and a core made of a material A' different from the first material A.

According to one example, the partial etching is configured to selectively etch the second material B with regards to the first material A.

According to one example, the partial etching has an etching selectivity $S_{B:A}$ of the second material B with regards to the first material A greater than 5:1.

According to one example, the at least one narrow portion preserved upon completion of the partial etching is the at least one pad of the composite layer.

According to one example, the method further comprises, before partial etching, the formation of a hard mask based on the second material B over the second face of the device.

According to one example, the partial etching is configured to selectively etch the second material B with regards to the glue C.

According to one example, the partial etching has an etching selectivity $S_{B:C}$ of the second material B with regards to the glue C greater than 2:1, and possibly greater than 5:1.

According to one example, the first material A is a silicon oxide and the second material B is selected from among Copper, a polymer, amorphous silicon or polycrystalline silicon.

According to one example, the second material B is amorphous silicon or polycrystalline silicon and the partial etching is performed by xenon fluoride XeF2 based plasma.

According to one example, the at least one pad is centred with respect to the first face of the device, in projection according to a direction z normal to the base plane xy.

According to one example, the at least one pad has a height strictly smaller than a thickness of the bonding layer.

According to one example, the at least one pad has a height equal to a thickness of the composite layer.

According to one example, the bonding layer comprises only one glue layer based on a glue C.

According to one example, the partial etching is configured to isotropically etch the glue C, so that the at least one narrow portion preserved upon completion of the partial etching is approximately centred with respect to the first face of the device, in projection according to a direction z normal to the base plane xy.

According to one example, the glue C is polyimide-based.

According to one example, the partial etching is a wet etching based on an oxalic acid and amine solution.

Except in the case of incompatibility, technical features described in detail for a given embodiment may be combined with the technical features described in the context with other embodiments described for exemplary and non-limiting purposes, so as to form another embodiment which is not necessarily illustrated or described. Of course, the invention does not exclude such an embodiment.

In the present invention, the transfer method is dedicated in particular to transferring light-emitting diodes (LED) from a donor substrate onto a receiver substrate.

The invention may be implemented more broadly for different optoelectronic or microelectronic devices with a 3D architecture.

Hence, the invention may also be implemented in the context of laser or photovoltaic devices, or else in the context of microelectronic devices comprising stacks of structures transferred onto top of each other.

Unless explicitly stated otherwise, it is specified that, in the context of the present invention, the relative arrangement of a third layer interposed between a first layer and a second layer, does not necessarily mean that the layers are directly in contact with each other, but means that the third layer is either directly in contact with the first and second layers, or separate from these by at least one other layer or at least one other element.

The steps of the method as claimed should be understood in a broad sense and may be possibly be carried out in several sub-steps.

By "narrow portion", it should be understood an exposed portion of the bonding layer, after partial etching. This portion is physically bordered, at least in the plane xy. It is not conceptually or intellectually defined within the bonding layer.

By "bonding surface", it should be understood the effective contact surface between the first face of the device and the bonding layer.

By "adhesive force" or "adherence", it should be understood the force necessary to separate the device(s) off the handling substrate, after assembly. The adhesive force may be quantified by a centrifugal testing technology known by the acronym CATT.

In the present patent application, the terms "light-emitting diode", "LED" or simply "diode" are used as synonyms. A "LED" may also be understood as a "micro-LED".

Next, the following abbreviations relating to a material M are possibly used:

- a-M refers to the material M in the amorphous form, according to the terminology commonly used in the microelectronics field for the prefix a-.
- p-M refers to the material M in the polycrystalline form, according to the terminology commonly used in the microelectronics field for the prefix p-.

By a substrate, a layer, a device, "based" on a material M, it should be understood a substrate, a layer, a device comprising this material M alone or this material M and possibly other materials, for example alloy elements, impurities or doping elements.

A reference frame, preferably orthonormal, comprising the axes x, y, z is represented in some appended figures. By extension, this reference frame is applicable to the other appended figures.

In the present patent application, we will preferably talk about a thickness for a layer and a height for a structure or a device. The thickness is considered according to a direction normal to the main plane of extension of the layer, and the height is considered perpendicularly to the base plane xy of the substrate. Thus, a layer typically has a thickness according to z, and a LED has a height according to z. The relative terms "beneath", "underlying" refer to positions considered according to the direction z.

The dimensional values should be understood within the manufacturing and measurement tolerances.

The terms "substantially", "about", "in the range of" mean, when they refer to a value, "within 10%" of this value or, when they relate to an angular orientation, "within 10°" from this orientation.

Thus, a direction substantially normal to a plane means a direction having an angle 90+10° with respect to the plane.

In order to determine whether a device transfer has been carried out according to the method described in this invention, an analysis by scanning electron microscopy (SEM) or by transmission electron microscopy (TEM) may be performed.

In particular, a cross-sectional observation of the bonding layer can determine whether this bonding layer comprises a composite layer and/or a narrow attachment pad.

A general principle of the invention consists in transferring a first time at least one and preferably several devices onto a bonding layer of a handling substrate, then in partially etching this bonding layer so as to preserve a narrow portion of this bonding layer between each of the devices and the handling substrate. The devices can then be transferred a second time, typically onto a receiver substrate.

The narrow portion reduces the adhesive force between the handling substrate and the devices, and facilitates the separation and the transfer of the devices.

A first example of transfer of at least one optoelectronic device according to the invention will now be described with reference to FIGS. 1 to 5.

As illustrated in FIG. 1, a substrate 1 carrying devices 10 is provided. Typically, these devices are optoelectronic devices in the form of mesas. They have a characteristic dimension $L_{10}$ according to x typically comprised between a few hundred nanometres, for example 500 nm, and a few tens microns, for example 30 μm, 50 μm and possibly 100 μm. They may have a height according to z in the range of a few hundred nanometres, for example 500 nm, to a few microns, for example 5 μm, 10 μm, and possibly 20 μm. The devices 10 may comprise or be based on LEDs with a three-dimensional (3D) architecture, and in particular nanowires.

Preferably, the devices 10 are remote from each other by a distance $d_{10}$ in the range of a few microns, for example comprised between 1 μm and 100 μm.

The devices 10 may be partially encapsulated by an encapsulation layer 11. Typically, this encapsulation layer 11 is configured to surround and separate the devices 10 from each other, in projection in the plane xy. It allows improving the mechanical hold of the devices onto the substrate 1. Preferably, this encapsulation layer 11 is flush with the exposed faces 101 of the devices 10, without covering them.

The faces 101 of the devices 10 are intended to come into contact with a bonding layer 30 of a handling substrate 3. These faces 101 do not necessarily extend over the entire characteristic dimension $L_{10}$ of the devices 10. They may form at least one step having for example a height comprised between 5 and 15 μm. In this case, the step may be embedded or absorbed into a glue layer 303. By extension, the face 101 may be the bonded face of the device 10.

Typically, the glue layer 303 is based on a glue C such as polyimide, for example Kapton®, for example a HD-3007 (DuPont®) polyimide. It may be formed over the face 101 of the devices 10 or over the composite layer 300, prior to bonding. Thus, the bonding layer 30 may comprise the composite layer 300 and all or part of the glue layer 303. The glue layer 303 has a thickness comprised between a few hundred nanometres, for example 200 nm, and a few microns, for example 15 μm, 20 μm, and possibly 50 μm.

Typically, the bonding layer 30 has a planar free face 3101, extending according to a plane xy.

For a given device 10, the bonding surface may be defined as being the contact surface between the face 101 of the device and the free face 3101 of the bonding layer 30. According to one possibility, the bonding surface corresponds to the surface bonded over the face 101 of the device.

According to a first embodiment, the bonding layer 30 preferably comprises the glue layer 303 and a composite layer 300 formed of pads 301 and of a matrix 302. According to this embodiment, the narrow portion preserved beneath each device 10 upon completion of the partial etching of the bonding layer is a pad 301.

Preferably, the composite layer 300 is directly in contact with the handling substrate 3. Preferably, it has a constant thickness comprised between a few hundred nanometres, for example 200 nm, and a few microns, for example 10 μm.

Typically, the pads 301 are based on a first material A, for example silicon oxide. Alternatively, they have a shell based on this first material A. For example, the pads 301 may comprise a core made of silicon surround by a silicon oxide based shell. The pads 301 have a height preferably equal to the thickness of the composite layer 300. They have a dimension, for example a length $L_{301}$ according to x, comprised between a few tens of nanometres, for example 100 nm, and a few microns, for example 10 μm. The length of the studs 301 is selected such that $L_{301}<L_{10}$.

Moreover, the pads 301 are distributed within the composite layer 300 so as to coincide, in projection in the plane xy, with the devices 10. Thus, they can be separated from each other by a distance $d_{301}$ such that: $d_{301}+L_{301}=d_{10}+L_{10}$. The distribution of the pads 301 in the composite layer 300 may be such that there are no pads 301 opposite the encapsulation layer 11, when positioning the donor substrate 1 with respect to the handling substrate.

In FIG. 1, one single pad 301 is positioned with respect to each device 10. According to one possibility, a plurality of pads with smaller lengths may be substituted to each illustrated unitary pad 301. Thus, instead of having one single pad 301 intended to support a device 10, at least two, three or four smaller pads may be provided. In this example, the pad(s) are intended to form feet supporting the device 10 after partial etching of the bonding layer 30. In general, the pads 301 are configured so that the total surface, in the plane xy, of the pads supporting a device 10 is smaller than the bonding surface of the device 10. Thus, for X (X=1 . . . 4) pads 301 with a section $S_{301}$ supporting the same device 10 evenly bonded at its face 101 with a surface $S_{101}$, we have $X.S_{301}<S_{101}$. Preferably, the pads 301 have a constant section along the axis z. According to another possibility, this section varies along z. In this case, it is the total surface of the minimum sections of the pads that is selected smaller than the bonding surface.

According to another possibility, a plurality of pads 301 having lengths such that que $L_{301}<d_{10}$ and $L_{301}<d_{301}$, for example $L_{301}\leq 10.d_{10}$ and/or $L_{301}<10.d_{301}$, are evenly distributed over the entire surface of the handling substrate 3. This allows reducing the constraint on the accuracy of positioning between the device 10 and the pad(s) 301 when transferring the devices. Thus, it is not necessary to keep a very accurate alignment between the substrate 1 and the handling substrate 3 when transferring the devices. In this case, the devices 10 will always rest on one or more pad(s) 301. Furthermore, two devices 10 will not be bonded to the same pad 301. This allows considering an individualised transferring of each device 10.

Typically, the matrix 302 is based on a second material B different from the first material A, for example copper, poly(methyl methacrylate) (PMMA), polyimide, polycrystalline silicon (p-Si). The matrix 302 extends between the pads 301.

Figure 2:
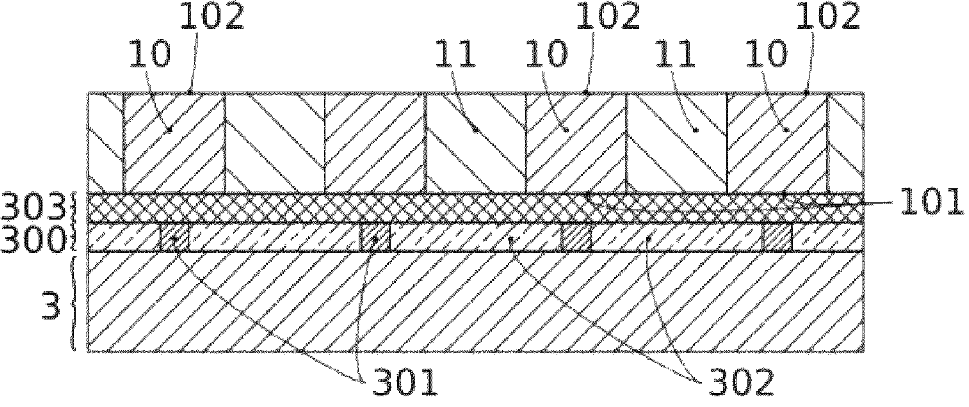
FIG. 2 illustrates devices assembled to the handling substrate, after elimination of the donor substrate, according to an embodiment of the present invention.

After positioning the donor substrate 1 with respect to the handling substrate 3, so that each of the devices 10 is opposite at least one pad 301, the donor substrate 1 and the handling substrate 3 are assembled (FIG. 2). The devices 10 are then bonded at their face 101 over the glue layer 303. Henceforth, the donor substrate 1 may be removed, typically by mechanical trimming and/or chemical-mechanical polishing. Preferably, a face 102 of each device 10, opposite to the face 101, is exposed upon completion of the removal of the donor substrate 1. At this level, the bonding layer 30 is solid and does not have any cavity. Thus, it ensures an excellent hold of the devices 10 during the removal of the donor substrate 1. The encapsulation layer 11 also contributes to the lateral hold of the devices during the removal of the donor substrate 1. The adhesive force of the devices 10 and/or of the encapsulation layer 11 over the handling substrate 3 is optimum for the step of removing the donor substrate 1.

The next steps aim to reduce this adhesive force between the devices 10 and the handling substrate 3, in preparation for a separation of the devices 10 off the handling substrate 3, for transferring the devices 10 onto a receiver substrate.

Figure 3A:
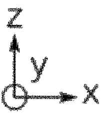
FIG. 3A illustrates a step of separating the devices from each other, according to an embodiment of the present invention.
Figure 3A:
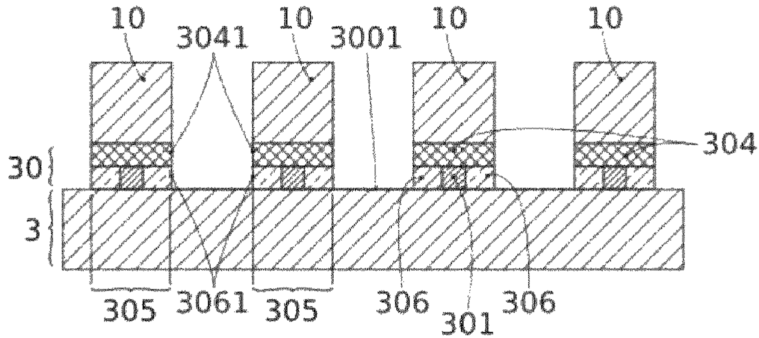
Figure 4:
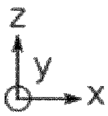
FIG. 4 illustrates the formation of narrow portions in the bonding layer in preparation for the separation of the devices off the handling substrate, according to an embodiment of the present invention.
Figure 4:
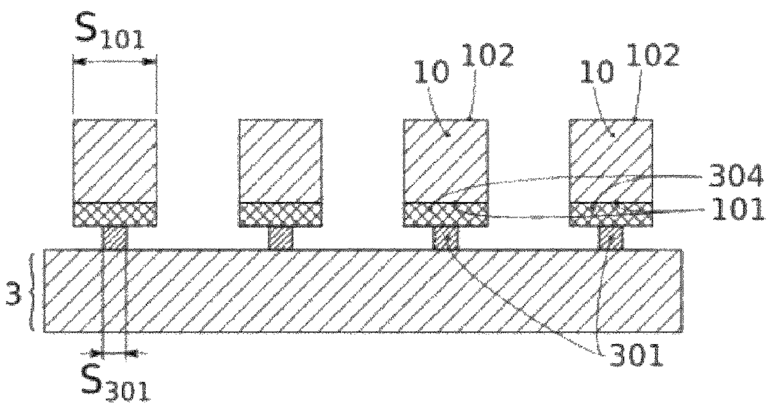

According to an example illustrated in FIG. 3A, the devices 10 are separate from each other by etching of the encapsulation layer 11. This anisotropic etching directed according to z is configured to remove the bonding layer portions 30 located between the devices 10, in projection in the plane xy. Thus, according to this possibility, the stoppage of the anisotropic etching is done over the handling substrate 3, at a face 3001. Thus, each device 10 forms a stack according to z with a glue layer portion 304, and a composite layer portion 305. Each portion 305 comprises at least one pad 301 and at least one matrix portion 306. The anisotropic etching herein allows exposing sidewalls 3041 of the portions 304 and sidewalls 3061 of portions 306. According to this example, the portions 306 are etched from the sidewalls 3061, by selective isotropic etching, so as to preserve only the pads 301, as illustrated in FIG. 4. Typically, this selective isotropic etching may be a dry etching, for example by xenon fluoride XeF2 based plasma if the portions 306 to be etched are Si or polySi based. Alternatively, this selective isotropic etching may typically be a wet etching, for example based on a FotoPur® (BASF®) solution if the portions 306 to be etched are based on HD3007 bond.

Figure 3B:
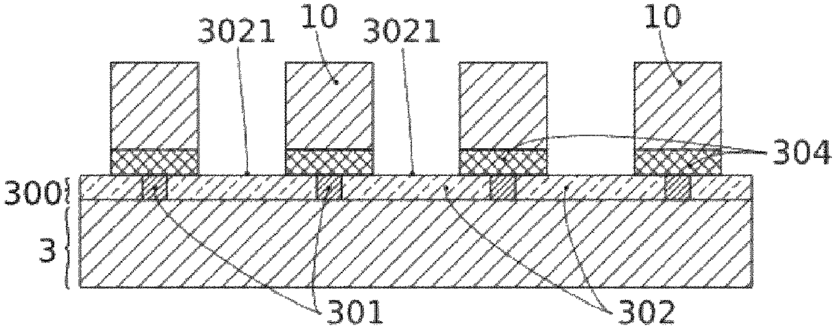
FIG. 3B illustrates a variant of the step of separating the devices from each other, illustrated in FIG. 3A.

According to another example illustrated in FIG. 3B, only the glue layer portions located between the devices 10 are removed by anisotropic etching. The stoppage of the anisotropic etching is herein done at the matrix 302 of the composite layer 300. According to this example, the matrix 302 is etched from the exposed faces 3021, by selective etching, so as to preserve only the pads 301, as illustrated in FIG. 4. In this case, an essentially anisotropic selective etching followed by an over-etching may be implemented to reach the pads 301. Alternatively, an essentially isotropic selective etching may be implemented to reach the pads 301. Typically, the selective anisotropic etching may be a dry etching.

As illustrated in FIG. 4, in all cases, etching of the matrix 302 is configured to preserve the pads 301, and at least partially the portions 304. Thus, etching of the matrix 302 is a selective etching of the second material B with regards to the first material A. For example, it has an etching selectivity $S_{B:A}$ greater than 5:1. Etching of the matrix 302 is also a selective etching of the second material B with regards to the glue C. For example, it has an etching selectivity $S_{B:C}$ greater than 2:1 and possibly 5:1. Etching of the matrix 302 is also a selective etching of the second material B with regards to the material(s) of the device 10. This allows preserving the device 10 during said etching.

Upon completion of this selective etching, the device 10 is secured to the handling substrate 3 via its face 101 with a surface $S_{101}$ upon contact with the portion 304, and via the pad 301 with a section $S_{301}$, with $S_{301}<S_{101}$.

The adhesive force between the handling substrate 3 and the device 10 is herein decreased in comparison with the situation illustrated in the previous FIGS. 3A and 3B. This is due to the section reduction in the bonding layer 30 underlying the device 10. Thus, the subsequent separation of the device(s) 10 of the handling substrate is facilitated.

Figure 5:
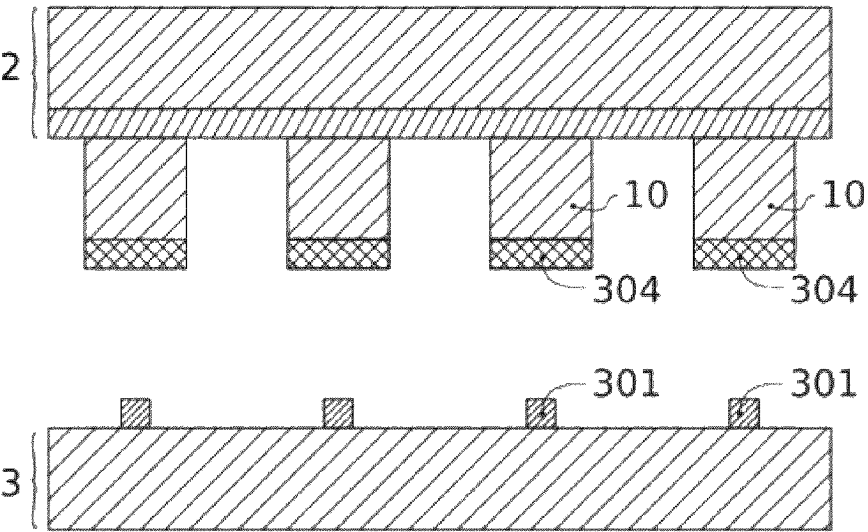
FIG. 5 illustrates a step of separating the devices off the handling substrate, and transfer thereof onto a receiver substrate, according to an embodiment of the present invention.
Figure 6:
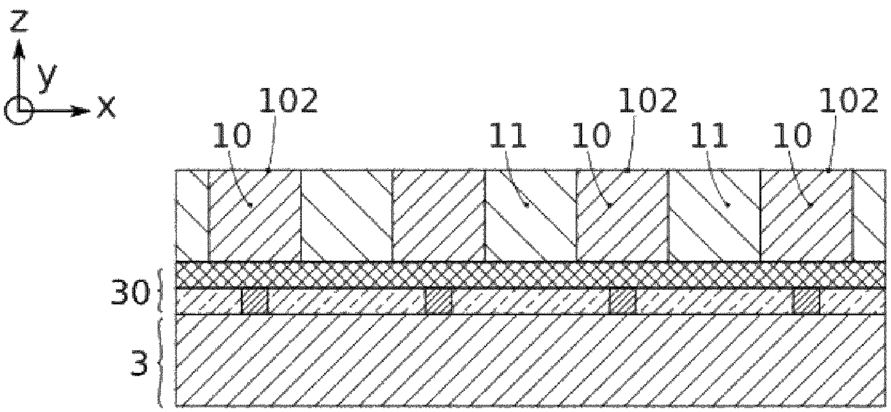
FIGS. 6 to 9 illustrate steps of a method for transferring devices according to another embodiment of the present invention.

FIG. 5 illustrates transferring of the devices 10 onto a receiver substrate 2, at their faces 102, and the consecutive separation of these devices 10 of the handling substrate 3, by tension according to z. The break-up under tension occurs at the pads 301, with a reduced section $S_{301}$. For example, the receiver substrate 2 may consist of PCB, glass, square glass plates, etc., and the handling substrate 3 may be of the printing buffer type, for example as implemented in nanoprinting techniques.

Figure 7:
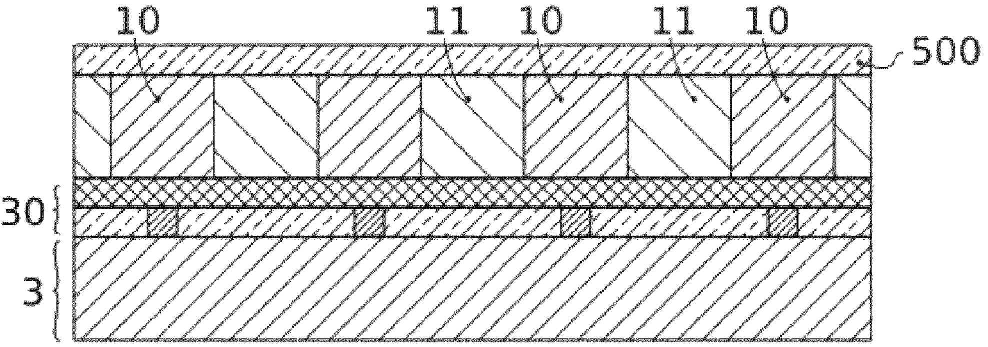

According to a variant to the first embodiment illustrated in FIGS. 6 to 9, after bonding the devices 10 and removal of the donor substrate 1 (FIG. 6), a hard mask layer 500 is deposited over the faces 102 of the devices 10 and/or over the encapsulation layer 11 (FIG. 7).

Figure 8:
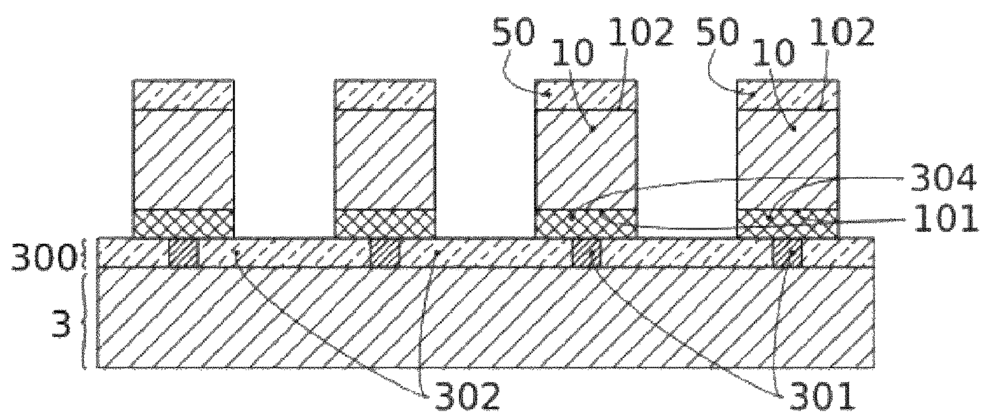

As illustrated in FIG. 8, one or more anisotropic etching(s) directed according to z allow etching portions of the layer 500 surmounting the encapsulation layer 11, then the encapsulation layer 11 then portions of the glue layer beneath the encapsulation layer 11. This allows forming at first a hard mask 50 over the face 102 of the devices 10. Afterwards, this hard mask 50 allows protecting this face 102 during etching of the encapsulation layer 11, and during etching of the glue layer.

According to a preferred possibility, the layer 500 and, thereby, the hard mask 50 are based on the same material B as the matrix 302.

Figure 9:
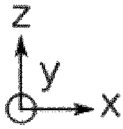
Figure 9:
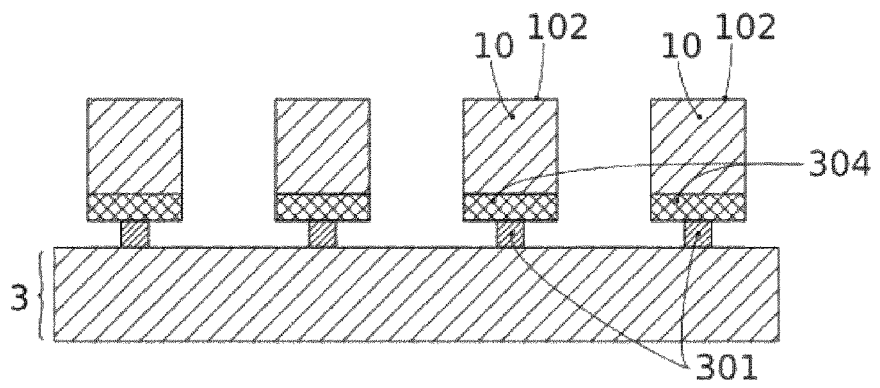

As illustrated in FIG. 9, the hard mask 50 may thus be eliminated at the same time as the matrix 302, during the selective etching of the material B with regards to the materials A and/or C. For a p-Si or a-Si based material B, a dry etching by xenon fluoride XeF2 based plasma may be used.

Like before, the adhesive force is decreased and the devices 10 may be separated more easily off the handling substrate 3.

According to a second embodiment illustrated in FIGS. 10 to 12B, the bonding layer 40 comprises only one glue layer 403. According to this embodiment, the narrow portion preserved beneath each device 10 upon completion of the partial etching of the bonding layer 40 is a glue pad 401.

Only the distinct features of the first embodiment are described hereinafter, the other non-described features are deemed to be identical to those of the first embodiment.

Figure 10:
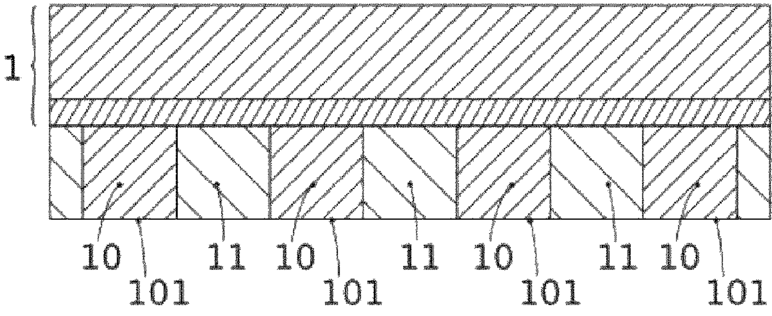
Figure 10:
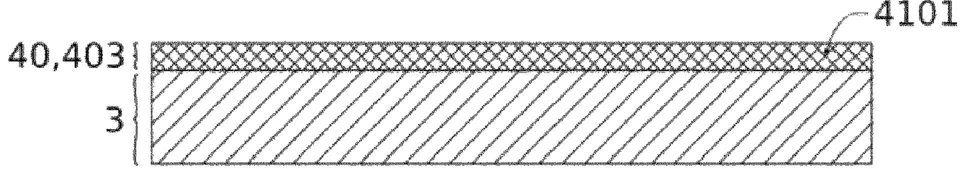

As illustrated in FIG. 10, the donor substrate 1 carrying the devices 10 is placed opposite the handling substrate 3 carrying the bonding layer 40, i.e. the glue layer 403. The faces 101 of the devices 10 are intended to be bonded over the free face 4101 of the glue layer 403.

Preferably, the glue layer 403 is directly in contact with the handling substrate 3. It has a thickness preferably constant and comprised between a few hundred nanometres, for example 200 nm, and a few microns, for example 10 μm and possibly 50 μm.

Typically, the glue layer 403 is based on a glue C such as polyimide, for example Kapton®. After assembly of the devices 10, it allows holding the devices during the removal of the donor substrate 1.

According to an alternative possibility (not illustrated) forming a separate aspect of the invention, the bonding layer 40 or the glue layer 403 are formed or deposited over the devices 10 and over the encapsulation portions 11. Thus, the handling substrate 3 does not comprise the bonding layer 40, 403 in this embodiment. This allows selecting a handling substrate 3 independently of the formation of the bonding layer 40, 403. According to another possibility, the bonding layer 40, 403 is formed partly over the devices 10 and over the encapsulation portions 11, and partly over the handling substrate 3. Typically, the glue layer 403 is deposited over the two faces opposite each other before assembly.

Figure 11A:
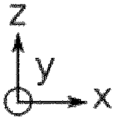
Figure 11A:
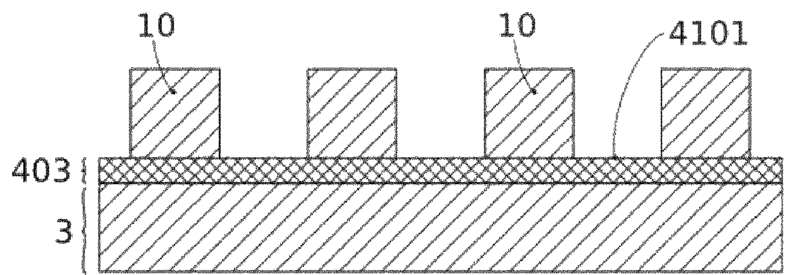

As illustrated in FIG. 11A according to one example, after removal of the donor substrate 1, the devices 10 can be separated from each other by etching of the encapsulation layer 11. This anisotropic etching directed according to z may be configured to remove the encapsulation layer 11 between the devices 10. Thus, according to this possibility, the stoppage of the anisotropic etching is done at the face 4101 of the glue layer 403.

Figure 12A:
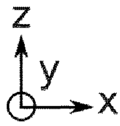
Figure 12A:
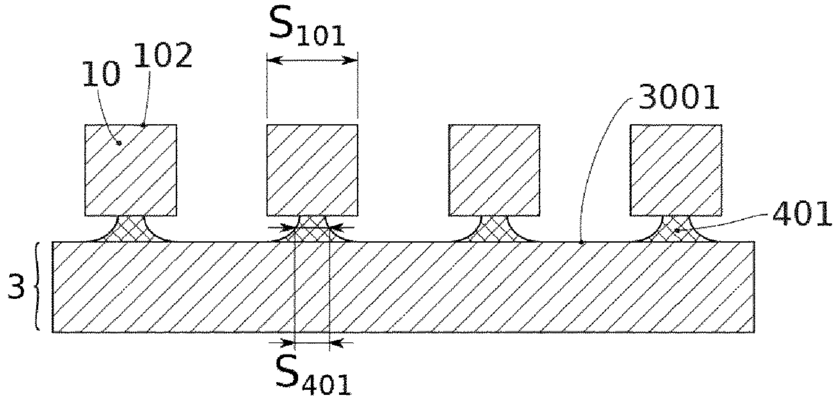

According to this example, afterwards, the glue layer 403 is partially etched from the exposed faces 4101, so as to form glue pads 401, as illustrated in FIG. 12A.

An essentially anisotropic etching followed by an over-etching may be implemented to form the glue pads 401. Alternatively, an essentially isotropic etching may be implemented to form the glue pads 401. Typically, the control of the section of the pads, in the plane xy, may be done by adjusting the duration of the etching and/or of the over-etching.

Figure 11B:
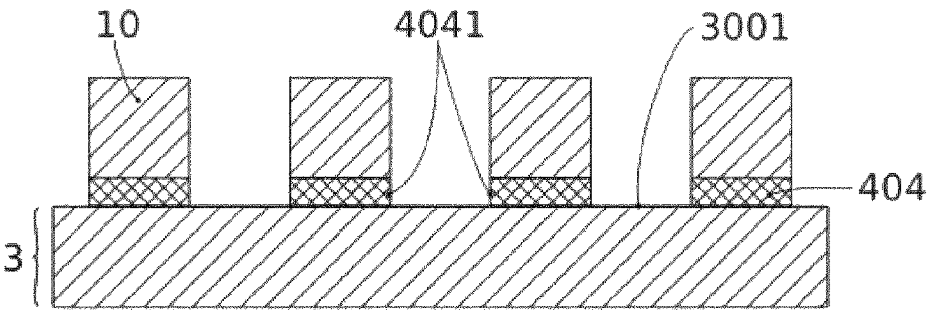

According to a variant illustrated in FIG. 11B, the anisotropic etching directed according to z may be configured to remove the encapsulation layer 11 between the devices 10, as well as the glue layer portions 403 located between the devices 10, in projection in the plane xy. Thus, according to this possibility, the stoppage of the anisotropic etching is done at the handling substrate 3, at a face 3001. Thus, each device 10 forms a stack according to z with a glue layer portion 404. The anisotropic etching herein allows exposing sidewalls 4041 of the portions 404.

Figure 12B:
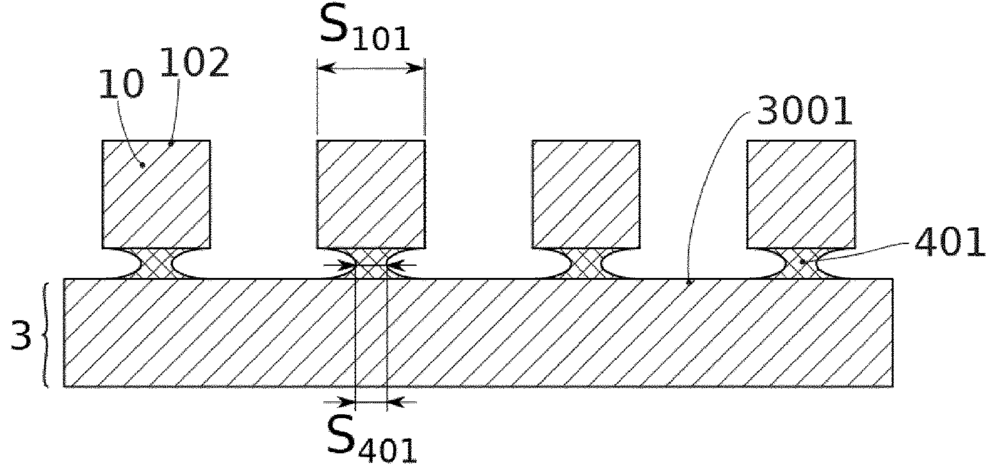

According to this example, the portions 404 are partially etched starting from the sidewalls 4041, by isotropic etching, so as to form the glue pads 401, as illustrated in FIG. 12B.

The partial etching of the glue layer 403 may be performed by wet etching based on a FotoPur® (BASF®) solution, or else based on an oxalic acid and amine solution. Other etching solutions known to a person skilled in the art are also possible.

Upon completion of the partial etching of the glue layer 403 or of the portions 404, the glue pads 401 are formed and each device 10 is secured to the handling substrate 3 via a glue pad 401.

Each glue pad 401 has a section $S_{401}$, in the plane xy, typically variable according to z. The partial etching is configured so that the minimum section $S_{401}$ of the glue pad 401 is smaller than the surface $S_{101}$ of the face 101 of the device 10. This minimum section $S_{401}$ may be located at different heights according to z of the glue pad 401. For example, the minimum section $S_{401}$ may be located at the top of the glue pad 401, in the immediate proximity of the face 101, as illustrated in FIG. 12A. According to another example, the minimum section $S_{401}$ may be located at a mid-height of the glue pad 401, as illustrated in FIG. 12B. According to another example, the minimum section $S_{401}$ may be located at the bottom of the glue pad 401, in the immediate proximity of the face 3001 of the handling substrate 3 (not illustrated).

The adhesive force between the handling substrate 3 and the device 10 is herein decreased in comparison with the situations illustrated in the previous FIGS. 11A and 11B. Thus, the subsequent separation of the device(s) 10 off the handling substrate 3 is facilitated.

Transferring the devices 10 onto a receiver substrate 2, at their faces 102, and the consecutive separation of these devices 10 of the handling substrate 3, may be performed like before. During the separation by tension according to z, the break-up under tension occurs herein at the pads 401, with a reduced section $S_{401}$.

Preferably, a cleaning of the faces 102 and/or 101 of the devices is performed after separation and before transferring onto the receiver substrate 2, for example by plasma or in solution.

The invention is not limited to the previously-described embodiments and extends to all of the embodiments covered by the claims.

The invention claimed is:

1. A method for transferring an optoelectronic device from a first substrate to a second substrate via a handling substrate, said method comprising at least the following steps:

provide the first substrate carrying the optoelectronic device, provide the handling substrate, bond the optoelectronic device over the handling substrate via a bonding layer at a first face of the device, said first face having a bonding surface extending according to a base plane, remove the first substrate, partially etch the bonding layer so as to preserve a narrow portion of the bonding layer interposed between the first face of the device and the handling substrate, said narrow portion having a cross-section, considered in a plane parallel to the base plane, strictly smaller than the bonding surface, detach the optoelectronic device of the handling substrate, the method being characterised in that the bonding layer is formed prior to bonding over the handling substrate and only over the handling substrate.

2. The method according to claim 1, wherein the bonding surface extends only according to the base plane.

3. The method according to claim 1, wherein the bonding layer comprises at least one glue layer, and wherein the first face of the device is only in contact with the glue layer.

4. The method according to claim 1, wherein the detachment of the optoelectronic device comprises:

transferring the optoelectronic device onto a second substrate, at a second face of the device opposite to the first face, removing the handling substrate.

5. The method according to claim 1, wherein the partial etching of the bonding layer comprises:

an anisotropic etching directed mainly according to a direction normal to the base plane and configured to remove the bonding layer around the device, in projection according to a direction normal to the base plane, so as to cut out the device, then an isotropic etching configured to form the narrow portion beneath the device, in projection according to a direction normal to the base plane.

6. The method according to claim 5, wherein the anisotropic etching is performed by cutting.

7. The method according to claim 5, wherein the anisotropic and isotropic etchings are performed by plasma.

8. The method according to claim 5, wherein the isotropic etching corresponds to a step of over-etching obtained by exceeding a predetermined duration threshold for the anisotropic etching, and by carrying on the anisotropic etching for an over-etching duration beyond said predetermined duration threshold.

9. The method according to claim 1, wherein the bonding layer comprises a composite layer over the handling substrate, said composite layer comprising at least one pad having an outer wall based on a first material A, and a matrix based on a second material B, and wherein the partial etching is configured to selectively etch the second material B to the first material A, so that the at least one narrow portion preserved upon completion of the partial etching is said at least one pad.

10. The method according to claim 9, further comprising the formation of a glue layer over the composite layer or over the entire first face of the device, prior to bonding the device, so that said glue layer is interposed between the composite layer and the first face of the device, after bonding.

11. The method according to claim 9, further comprising, before partial etching, the formation of a hard mask based on the second material B over a second face of the device opposite to the first face.

12. The method according to claim 9, wherein the at least one pad comprises a shell having the outer wall based on the first material A, and a core made of a material A' different from the first material A.

13. The method according to claim 10, wherein the glue layer is based on a glue C and the partial etching is configured to selectively etch the second material B to the glue C.

14. The method according to claim 9, wherein the first material A is a silicon oxide and the second material B is selected from among Copper, a polymer, amorphous silicon or polycrystalline silicon.

15. The method according to claim 9, wherein the second material B is amorphous silicon or polycrystalline silicon and the partial etching is performed by xenon fluoride XeF2 based plasma.

16. The method according to claim 9, wherein the at least one pad is centred with respect to the first face of the device, in projection according to a direction normal to the base plane.

17. The method according to claim 9, wherein the at least one pad has a height equal to a thickness of the composite layer.

18. The method according to claim 1, wherein the bonding layer comprises only one glue layer based on a glue C, and wherein the partial etching is configured to isotropically etch the glue C, so that the at least one narrow portion preserved upon completion of the partial etching is approximately centred with respect to the first face of the device, in projection according to a direction normal to the base plane.

19. The method according to claim 18, wherein the glue C is polyimide-based, and the partial etching is a wet etching based on an oxalic acid and amine solution.

* * * * *